(12) United States Patent
Watanabe et al.

(10) Patent No.: US 8,263,908 B2
(45) Date of Patent: Sep. 11, 2012

(54) HEATER PLATE AND A METHOD FOR MANUFACTURING THE HEATER PLATE

(75) Inventors: Katsumi Watanabe, Tokyo (JP); Akira Fukuchi, Tokyo (JP)

(73) Assignee: Furukawa-Sky Aluminum Corp. (JP)

( * ) Notice: Subject to any disclaimer, the term of this patent is extended or adjusted under 35 U.S.C. 154(b) by 377 days.

(21) Appl. No.: 11/823,515

(22) Filed: Jun. 28, 2007

(65) Prior Publication Data
US 2007/0257023 A1 Nov. 8, 2007

Related U.S. Application Data (63) Continuation of application No. 11/025,224, filed on Dec. 29, 2004, now abandoned.

(60) Provisional application No. 60/617,251, filed on Oct. 8, 2004.

(51) Int. Cl.
*H05B 3/68* (2006.01)
*H05B 3/44* (2006.01)
*H05B 3/00* (2006.01)

(52) U.S. Cl. ........................ 219/444.1; 219/544; 29/611

(58) Field of Classification Search .... 219/443.1–468.2, 219/535–544; 29/610.1, 611, 842–845
See application file for complete search history.

(56) References Cited

U.S. PATENT DOCUMENTS

| | | | |
|---|---|---|---|
| 2,875,312 A | 2/1959 | Norton | |
| 2,987,300 A | 6/1961 | Greene | |
| 6,371,357 B1 | 4/2002 | Watanabe | |
| 6,376,815 B1 | 4/2002 | Watanabe | |
| 6,552,311 B2 | 4/2003 | Watanabe | |
| 6,557,747 B2 | 5/2003 | Watanabe | |
| 6,799,735 B2 | 10/2004 | Watanabe | |
| 7,150,418 B2 | 12/2006 | Watanabe | |
| 7,154,070 B2 | 12/2006 | Watanabe | |

FOREIGN PATENT DOCUMENTS

| | | |
|---|---|---|
| CN | 1285762 | 11/2006 |
| CN | 100492108 | 5/2009 |
| EP | 1168420 A2 | 1/2002 |
| HK | 1089513 B | 12/2006 |
| JP | 11285775 A | 10/1999 |
| JP | 11342437 A | 12/1999 |
| JP | 2000005884 A | 1/2000 |
| JP | 2000-311932 | 11/2000 |
| JP | 2000311932 A | 11/2000 |
| JP | 2002008993 A | 1/2002 |
| JP | 3345852 B2 | 11/2002 |
| JP | 2004071363 A | 3/2004 |
| JP | 3552154 B2 | 8/2004 |

(Continued)

*Primary Examiner* — Sang Paik
(74) *Attorney, Agent, or Firm* — Cantor Colburn LLP (57) ABSTRACT

A heater plate may be manufactured by receiving a sheath heater within a groove portion formed in a base member made of aluminum or aluminum alloy. At least one joint member made of aluminum or aluminum alloy may be placed into the groove portion so as to fix the sheath heater in the groove portion. The joint member may have two correspondingly tapered portions facing each other which extend toward a lower end thereof such that a distance between the two tapered portions becomes narrower and a width of a surface portion contacting with the sheath heater in the joint member is larger than a width of the sheath heater. The base member and the joint member may be metal-bonded such that a force is added from an upper surface of the base member toward the sheath heater direction, wit the sheath heater fixed in place therebetween.

33 Claims, 8 Drawing Sheets

FOREIGN PATENT DOCUMENTS

| | | | |
|---|---|---|---|
| JP | 3578398 B2 | 10/2004 |
| JP | 2006108527 A | 4/2006 |
| JP | 3836602 B2 | 10/2006 |
| JP | 3895498 B2 | 3/2007 |
| JP | 4030823 B2 | 1/2008 |
| KR | 433110 | 5/2004 |
| TW | 166922 | 4/2003 |
| TW | 317662 I | 12/2009 |

Fig. 6 (a) when $\phi D \leqq w2$

Fig. 6 (b) when $\phi D \leqq w2$

HEATER PLATE AND A METHOD FOR MANUFACTURING THE HEATER PLATE

CROSS REFERENCE TO RELATED APPLICATION

The present application is a divisional application of U.S. patent application Ser. No. 11/025,224, filed on Dec. 29, 2004 now abandoned, the entire contents of which are incorporated herein by reference. The 11/025,224 application claimed the benefit of the date of the earlier filed provisional application, having U.S. Provisional Application No. 60/617,251, filed on Oct. 8, 2004, which is incorporated herein in its entirety and priority to which is also claimed herein.

FIELD OF THE INVENTION

The present invention relates to a heater plate for manufacturing a semiconductor or liquid crystal display containing a sheath heater used as heated in a vacuum container (vacuum chamber) in particular, and a heater plate used for drying, preheating in the step of manufacturing the display, and a manufacturing method of the heater plate. In addition, the heater plate can be used for a heater plate for manufacturing a thin type display such as a PDP (plasma Display Panel), FED (Field Emission Display), or ELD (Electro Luminescence Display). Furthermore, the invention can be applied to a general heater plate such as a heater plate for manufacturing a PTP sheet.

RELATED ART

A heater plate containing a heater within a metal base was widely used in a various technical fields such as an apparatus for manufacturing a semiconductor or liquid crystal display. In general, a sheath heater made of stainless steel is used as the heater for the heater plate. As defined by its construction, there can be found the following heater plates: a sheath heater is cast in aluminum (i.e., cast type heater plate), a sheath heater is sandwiched by stainless steel plates and fastened by the screw bolts (i.e., bolt fastening type heater plate), a sheath heater is sandwiched by the plates and welded in the periphery thereof (i.e., welding type heater plate), a sheath heater is sandwiched and soldered or soldered and diffusion bonded by pressing under vacuum or a prescribed gas atmosphere (i.e., solder, diffusion bonded type heater plate), or a sheath heater is sandwiched by the plates, then corresponding enclosing groove portion and enclosing protruding portion are formed in the entire periphery of the plates, and the plates with the groove portion and the protruding portion are forge-compressed to be bonded (i.e., forge-pressing type heater plate).

Figure 10:
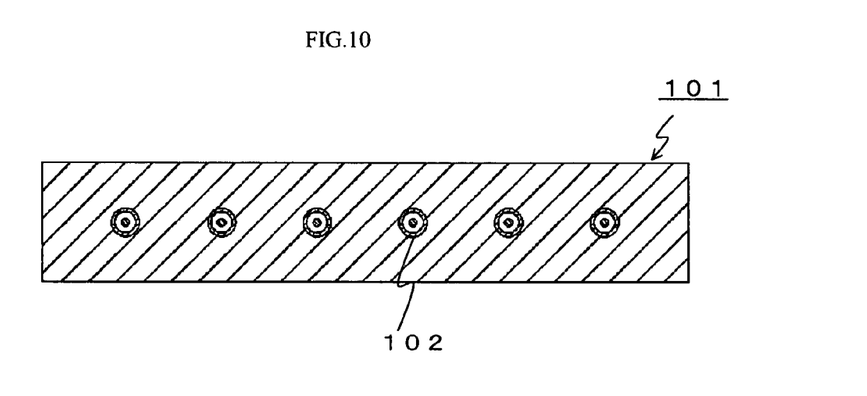
FIG. 10 is a schematic cross sectional view showing a conventional cast type heater plate with the sheath heater embedded.

FIG. 10 is a schematic cross sectional view showing the construction of the conventional cast type heater plate 101 containing the sheath heater 102 therein. A heat generating body is introduced into a protective pipe made of stainless steel, and electrically insulated therebetween by an insulating material, thus the sheath heater 102 is prepared. The prepared pipe type sheath heater 102 is bent in accordance with a prescribed pattern and cast in the aluminum base, then cut into a desired form, and the surface thereof is ground, additional workings are applied if necessary, to manufacture the heater plate 101.

Figure 11:
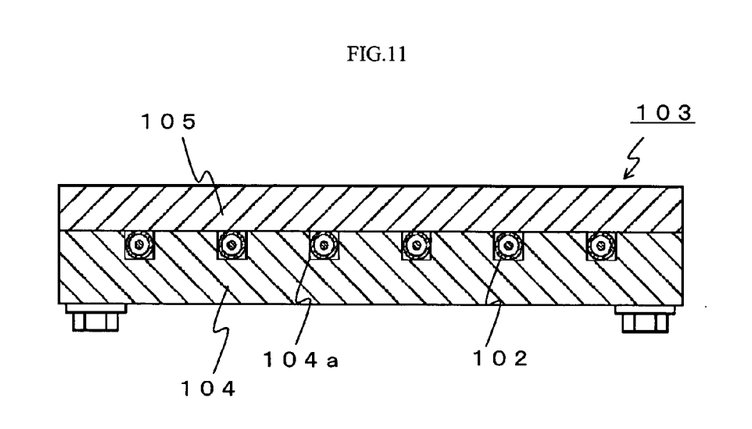
FIG. 11 is a schematic cross sectional view showing the conventional bolt fastening type heater plate.

FIG. 11 is a schematic cross sectional view showing the construction of the conventional bolt fastening type heater plate 103. In this construction, the metal base is divided into two, i.e., an upper base member and a lower base member. The same kind of the sheath heater 102 as described above is placed in groove portions 104a formed in the lower base member 104 made of aluminum, stainless steel or the like, then the upper base member 105 is fitted in a close contact manner to the lower base member with the sheath heater, and then fastened by screw bolts at appropriate positions so as to be integrated into a unit.

Figure 12:
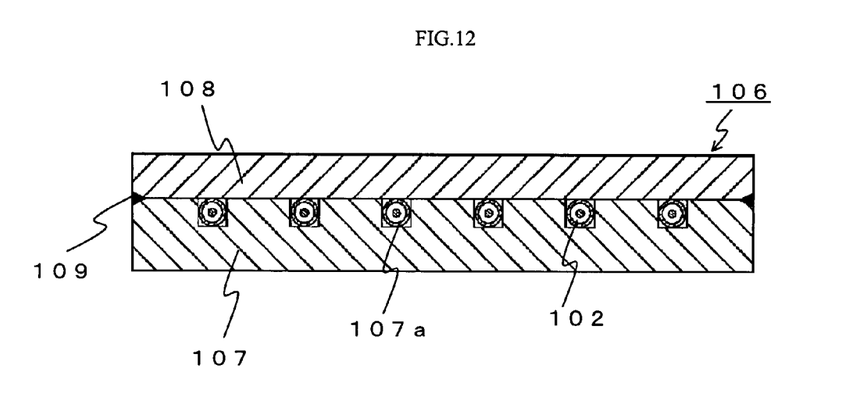
FIG. 12 is a schematic cross sectional view showing the conventional welding type heater plate.

FIG. 12 is a schematic cross sectional view showing the construction of the conventional welding type heater plate 106. In this construction, the metal base is also divided into two, i.e., an upper base member and a lower base member. The same kind of the sheath heater 102 as described above is placed in groove portions 107a formed in the lower base member 107 made of aluminum, stainless steel or the like, then the upper base member 108 is fitted in a close contact manner to the lower base member with the sheath heater, and then welded at only end peripheral portions 109 thereof so as to be integrated into a unit.

Figure 13:
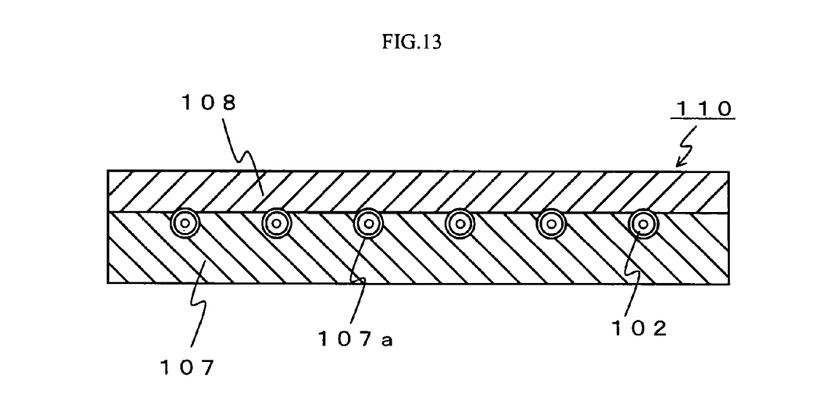
FIG. 13 is a schematic cross sectional view showing the conventional solder, diffusion bonded type heater plate.

FIG. 13 is a schematic cross sectional view showing the construction of the conventional solder, diffusion bonded type heater plate 110. In this construction, the metal base is also divided into two, i.e., an upper base member and a lower base member. The same kind of the sheath heater 102 as described above is placed in groove portions 107a formed in the region ranging from the metal lower base member 107 and the metal upper base member 108. All over the surfaces facing each other of the two base members are soldered, or soldered and diffusion bonded so as to be integrated into a unit.

Figure 14:
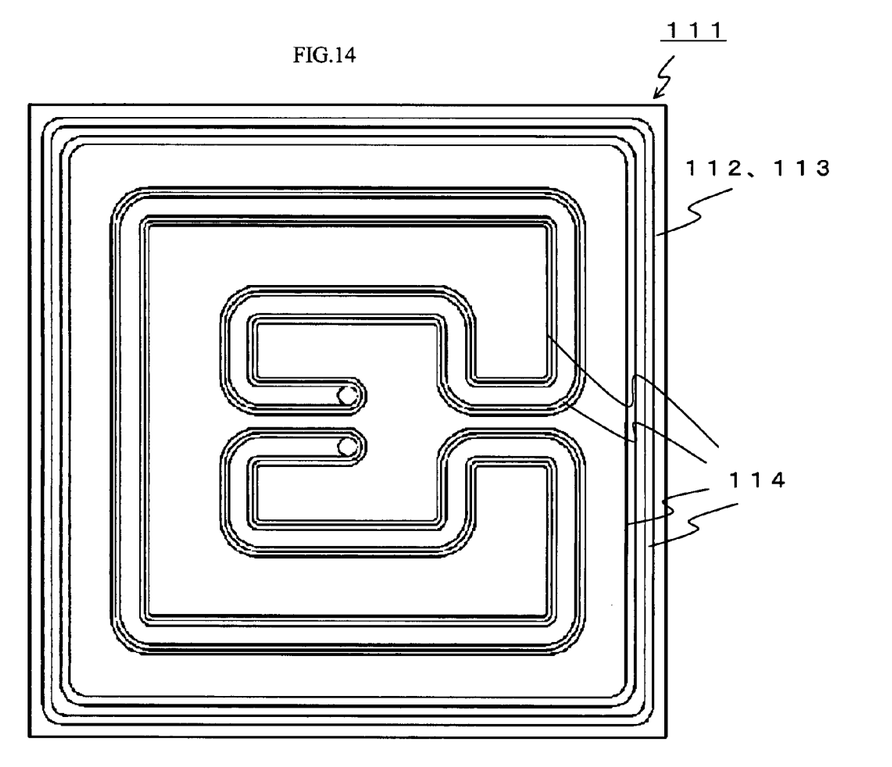
FIG. 14 is a schematic plan view explaining a forge-pressing type heater plate.

FIG. 14 is a schematic plan view explaining the construction of the conventional forge-pressing type heater plate 111. In this construction, the metal base is also divided into two, i.e., an upper base member and a lower base member. Enclosing groove portions and corresponding enclosing protruding portions, each of which has a square, polygonal or circular cross section, are formed at least around the entire peripheries on the surfaces to be jointed of the aluminum base members 112, 113, and the two aluminum base members are fitted and forge-pressed so as to be metal bonded and sealed at the bonded portions 114.

Together with a large-sizing of the liquid crystal TV, the heater plate rapidly becomes larger in size and recently within a few years the size thereof changes from the fourth generation of 730 mm×920 mm through the fifth generation of 1100 mm×1300 mm, sixth generation of 1500 mm×1800 mm to the seventh generation of 2100 mm×2400 mm. The longer lifetime of the heater plate and the lower cost by the simplified manufacturing process are required together with the larger sizing of the heater plate.

In the constructions of the heater plate described above, the cast type heater plate has an excellent heat transfer property of the heater, since the sheath heater is closely contacted with the aluminum casting. However, since the thermal expansion coefficient of the metal such as the stainless steel, Incoloy (trademark) material or the like used for the protective pipe of the sheath heater and that of the aluminum metal base are different, the heater is deformed by the heat stress at the high temperature, the heater is broken by the repetitive use, and in some case, even the entirety of the heater plate is deformed.

In the bolt fastening type heater plate, there may exist gaps in the grooves, and the gaps function as heat insulating layers. In addition, since the members merely physically contact each other, adhesiveness is low between the base members and the sheath heater, or the upper base member and the lower base member, thus deteriorating the heat transfer property. In some case, the temperature rises locally so as to damage the heater. The welding type heater plate has the same problem as those described above. Furthermore, the welding type heater plate has a large distortion by welding to have difficulty to maintain the original shape.

In the solder, diffusion bonded type heater plate, since entire surfaces facing each other are pressed to be bonded under vacuum or nitrogen gas atmosphere, it is difficult to bond the large sized members, and in addition, there is necessitated the third joint member for bonding such as soldering, soft solder or the like.

In the forge-pressing type heater plate, since the size of the heater plate becomes larger, according to the method as disclosed in Japanese patent provisional publication No. 2000-311932 in which the recessed portions and the corresponding protruding portions are formed on the respective outer peripheral portions and in the vicinity of the heater in the plate members, and the recessed portions and the corresponding protruding portions are fitted and forge-pressed to be bonded, there appeared creep deformation by using for the long period of time at the high temperature range of 300 to 500 degree centigrade, and the outer peripheral portion, the vicinity of the heater or the inner portion thereof near the center of the plate member are deformed by the heat stress, thus the heater plate cannot be used anymore.

As described above, since the size of the heater plate becomes larger, the heater plate may be deformed and the cost for manufacturing the heater plate becomes higher. It is therefore necessary to improve the conventional forge-pressing method.

The present invention is made in view of the conventional technical problems described above. One of the objects of the present invention is to provide a heater plate and the method for manufacturing same in which the deformation of the heater plate by the heat stress can be effectively prevented, the heat transfer property thereof is excellent and the durability thereof is high.

SUMMARY OF THE INVENTION

The first embodiment of the heater plate of the invention is a heater plate manufactured by receiving a sheath heater within a groove portion formed in a base member made of aluminum or aluminum alloy, placing at least one joint member made of aluminum or aluminum alloy into said groove portion so as to fix said sheath heater in the groove portion, forge-pressing said base member and said joint member to metal joint same with said sheath heater fixed in place therebetween.

In the second embodiment of the heater plate of the invention, said joint member comprises a single member.

In the third embodiment of the heater plate of the invention, said joint member comprises a plurality of members arranged along a surface direction of said base member.

In the fourth embodiment of the heater plate of the invention, said joint member comprises a plurality of members arranged along a thickness direction of said base member.

In the fifth embodiment of the heater plate of the invention, a layout of said sheath heater is point-symmetrical in relation to a center point in a cross section or symmetrical in relation to one of two orthogonal center lines in a cross section of said base member.

In the sixth embodiment of the heater plate of the invention, said base material comprises a plate member.

In the seventh embodiment of the heater plate of the invention, a cross sectional area of said joint member is larger than an effective cross sectional area obtained by subtracting a cross sectional area of said sheath heater from a cross sectional area of said groove portion.

In the eighth embodiment of the heater plate of the invention, said joint member has two correspondingly tapered portions facing each other which extend toward a lower end thereof in a manner that a distance between said two tapered portions becomes narrower.

In the ninth embodiment of the heater plate of the invention, a ratio of a height of said joint member to a width of a lower end of said tapered portions or a width of a lower end of said joint member is within a range from 1 to 5.

In the tenth embodiment of the heater plate of the invention, an angle of the respective tapered portions of said joint member is within a range from over 0 to 45 degrees in relation to a vertical axis thereof.

In the eleventh embodiment of the heater plate of the invention, a cross sectional area of said joint member comprises a substantially T-shaped member having a vertical bar portion and a lateral bar portion, both of which portions are jointed to said base member.

In the twelfth embodiment of the heater plate of the invention, at least a part of said vertical bar portion in said cross sectional area of said joint member is separated from a remaining portion including said lateral portion.

In the thirteenth embodiment of the heater plate of the invention, a cross sectional area of said joint member comprises a substantially T-shaped member having a vertical bar portion and a lateral portion, convex portions or concave portions for fitting are provided on the lateral portion in a different position from a position of the vertical bar portion and in which said sheath heater is not positioned, and corresponding concave portions and convex portions for fitting are provided in said groove portion of the base member to said convex portions or concave portions for fitting on the lateral portion.

In the fourteenth embodiment of the heater plate of the invention, a cross sectional area of said joint member comprises a substantially T-shaped member having a vertical bar portion and a lateral portion, bottom face of said lateral portion comprising two downwardly inclined faces from respective ends to a center of the lateral portion, thus said joint member forming a substantially Y-shape.

In the fifteenth embodiment of the heater plate of the invention, a ratio of a height to a width in the cross sectional area of the vertical bar portion in the T-shaped joint member is within a range of from 1 to 4.

In the sixteenth embodiment of the heater plate of the invention, 16. The heater plate as claimed in claim 12, wherein a ratio of a height to a width in the cross sectional area of the vertical bar portion in the T-shaped joint member is within a range of from 1 to 4.

In the seventeenth embodiment of the heater plate of the invention, a ratio of a respective height to a respective width in the cross sectional area of the vertical bar portion and said convex portion or concave portion in the T-shaped joint member is within a range of from 1 to 4.

In the eighteenth embodiment of the heater plate of the invention, a ratio of a height to a width in the cross sectional area of the vertical bar portion in the T-shaped joint member is within a range of from 1 to 4.

In the nineteenth embodiment of the heater plate of the invention, a face of the joint member to contact with the sheath heater is configured to be a parallel face to a face of the base member or a curved face having a same curvature as an outer periphery of said sheath heater.

In the twentieth embodiment of the heater plate of the invention, a width of a surface portion contacting with the sheath heater in the joint member is larger than a width of the sheath heater.

In the twenty first embodiment of the heater plate of the invention, a cross sectional area of the joint member before forge-pressing is larger than an effective cross sectional area obtained by subtracting a cross sectional area of said sheath heater from a cross sectional area of said groove portion in the base member, and there is a gap in at least a portion between a side face of the joint member and the groove portion of the base member, when the joint member is fitted into the groove portion of the base member.

In the twenty second embodiment of the heater plate of the invention, said sheath heater is arranged in each of a plurality of groove portions or a plurality of the sheath heaters are arranged in each of at least one groove portions formed in the base member.

In the twenty third embodiment of the heater plate of the invention, said plurality of the sheath heaters are arranged in parallel in each of at least one groove portions formed in the base member.

In the twenty fourth embodiment of the heater plate of the invention, said plurality of the sheath heaters are layered in a height direction in each of at least one groove portions formed in the base member.

In the twenty fifth embodiment of the heater plate of the invention, said sheath heater comprises a pipe configuration having a circular cross section or substantially rectangle (including square) with corner portions to be curved at a prescribed curvature, or a braided pipe configuration formed by braiding narrow bars.

In the twenty sixth embodiment of the heater plate of the invention, a sheath portion of the sheath heater has an excellent heat conduction to said joint member and said base member which receive the sheath heater.

In the twenty seventh embodiment of the heater plate of the invention, said joint member and said base member in which the sheath heater is received are hermetically sealed.

In the twenty eighth embodiment of the heater plate of the invention, the sheath heater has an excellent electrical insulation to said joint member and said base member which receive the sheath heater.

In the twenty ninth embodiment of the heater plate of the invention, said joint member and said base member comprises any one of alloy consisting of JIS1050, 1100, 3003, 3004, 5005, 5052, 6063, 6061, 7003, and 7N01.

The first embodiment of the method for manufacturing a heat plate of the invention comprising the steps of:
receiving a sheath heater within a groove portion formed in a base member made of aluminum or aluminum alloy;
placing at least one joint member made of aluminum or aluminum alloy into said groove portion so as to fix said sheath heater in the groove portion; and
forge-pressing said base member and said joint member to metal joint same with said sheath heater fixed in place therebetween.

In the second embodiment of the method of the invention, said joint member comprises a single member or divided plurality of members.

In the third embodiment of the method of the invention, said joint member comprises a plurality of members divided in a surface direction or a width direction of said base member.

In the fourth embodiment of the method of the invention, a cross sectional area of said joint member is larger than an effective cross sectional area obtained by subtracting a cross sectional area of said sheath heater from a cross sectional area of said groove portion.

In the fifth embodiment of the method of the invention, in case that said joint member are divided into a plurality of member, said plurality of members are forge-pressed in a prescribed order.

In the sixth embodiment of the method of the invention, said base member comprises a plate member.

In the seventh embodiment of the method of the invention, said joint member has two correspondingly tapered portions facing each other which extend toward a lower end thereof in a manner that a distance between said two tapered portions becomes narrower, and an angle of the respective tapered portions of said joint member is within a range from over 0 to 45 degrees in relation to a vertical axis thereof.

In the eighth embodiment of the method of the invention, said joint member has a cross section comprising substantially T-shaped configuration or Y-shaped configuration.

In the ninth embodiment of the method of the invention, a cross sectional area of said joint member comprises a substantially T-shaped member having a vertical bar portion and a lateral portion;
forming convex portions or concave portions for fitting on the lateral portion in a different position from a position of the vertical bar portion and in which said sheath heater is not positioned;
forming corresponding concave portions and convex portions for fitting in said groove portion of the base member to said convex portions or concave portions for fitting on the lateral portion; and
fitting said convex portions or concave portions for fitting in said lateral portion and said corresponding concave portions and convex portions for fitting in said groove portion, and forge-pressing thus fitted said joint member and said base member to be metal-jointed.

In the tenth embodiment of the method of the invention, a face of the joint member to contact with the sheath heater is configured to be a flat face parallel to a plate face of the base member or a curved face having a same curvature as an outer periphery of said sheath heater.

In the eleventh embodiment of the method of the invention, a cross sectional area of the joint member before forge-pressing is larger than an effective cross sectional area obtained by subtracting a cross sectional area of said sheath heater from a cross sectional area of said groove portion in the base member, and there is a gap in at least a portion between a side face of the joint member and the groove portion of the base member, when the joint member is fitted into the groove portion of the base member.

In the twelfth embodiment of the method of the invention, said joint member and said base member comprises any one of alloy consisting of JIS1050, 1100, 3003, 3004, 5005, 5052, 6063, 6061, 7003, and 7N01.

In the thirteenth embodiment of the method of the invention, said forge-pressing is carried out at a temperature within a range of from 250 to 500 degree centigrade.

A method for preventing deformation of a heater plate applying the manufacturing method as described above.

A method for improving hermetical sealing of the base member and the joint member by forge-pressing applying the method as described above.

A method for improving a lifetime of a heater by applying the method as described above.

One of the embodiment of the heater plate of the invention is the heater plate manufactured by receiving a sheath heater within a groove portion formed in a base member made of metal or metal alloy, placing joint member made of same kind of metal or metal alloy into said groove portion and fixing, and forge-pressing said base member and said joint member to be metal jointed.

In one of the embodiment of the heater plate, both of said base member and said joint member are copper or copper alloy.

BRIEF DESCRIPTION OF THE DRAWINGS

FIG. 5(a) shows an arrangement of the heater which is symmetrical in relation to a line passing the center of the heater plate, and FIG. 5(b) shows an arrangement of the heater which is point-symmetric in relation to the center passing the axis.

FIG. 6(a) shows a cross sectional shape which has tapered side portions in its entirety, FIG. 6(b) shows a cross sectional shape which has partial side portions, and FIG. 6(c) shows a cross sectional shape which has side portions having combined different angles;

FIG. 7(a) shows a cross sectional shape of one unit T-shaped type, FIG. 7(b) shows a cross sectional shape of the multiply divided T-shaped type, FIG. 7(c) shows a cross sectional shape of other one unit T-shaped type, FIG. 7(d) shows a cross sectional shape of other multiply divided T-shaped type, and FIG. 7(e) shows a cross sectional shape of the T-shaped type which has tapered portion of the lateral portion thereof.

DETAILED DESCRIPTION OF THE INVENTION

In the heater plate of the invention with the sheath heater embedded therein, the sheath heater is closely contacted with metal member so that the heat from the sheath heater is transferred to the metal member of the heater plate. In addition, the sheath heater is placed within the heater plate so as to uniformly heat the heater plate to a prescribed temperature. For example, the sheath heater is arranged in various configuration to uniformly heat the heater plate. The sheath heater comprises a heating wire and an insulating material enclosed within sheath member (i.e. pipe) made of stainless steel for example SUS304, nickel alloy for example Incoloy, or titanium. Number both of groove formed in the base member and the heater is appropriately selected according to the need, as described later.

Figure 15:
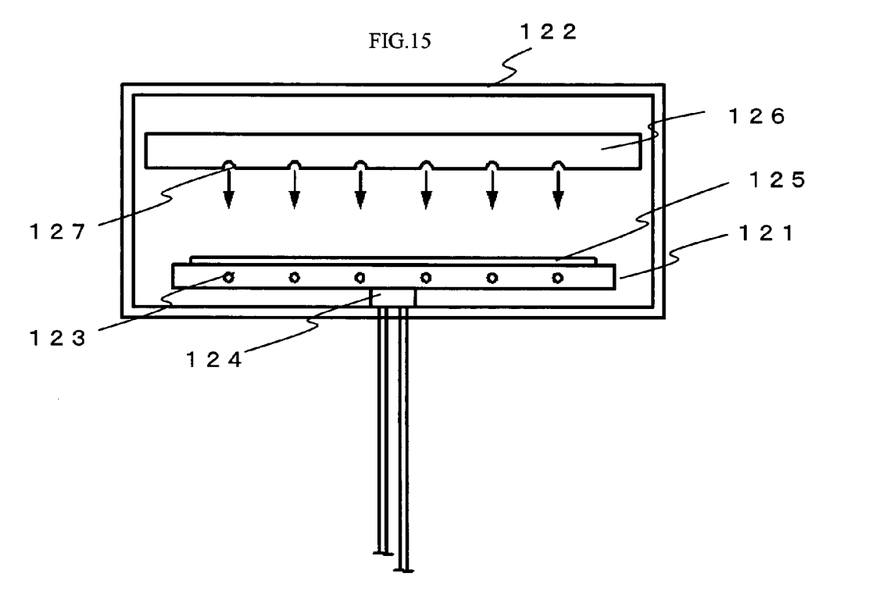
FIG. 15 is a schematic cross sectional view showing a CVD processing apparatus with the sheath heater arranged therein.

The heater plate of the invention with the sheath heater embedded therein is used for a heater plate received in the vacuum container (i.e., vacuum chamber) of an apparatus manufacturing semiconductor or liquid crystal. FIG. 15 shows an example to use the heater plate with the sheath heater embedded therein. More specifically, FIG. 15 shows a schematic cross sectional view showing a CVD processing apparatus. The heater plate 121 with the sheath heater 123 embedded therein is supported by an supporting member 124 and arranged within a vacuum chamber 122. A substrate 125 is mounted on the heater plate 121. Furthermore, a gas supplying portion 126 is provided in the vacuum chamber for the CVD processing. The gas is supplied from the supply port 127 to fabricate a film on the substrate by means of the chemical vapor deposition.

Preferable embodiments of the invention are described with reference to the drawings.

Figure 1:
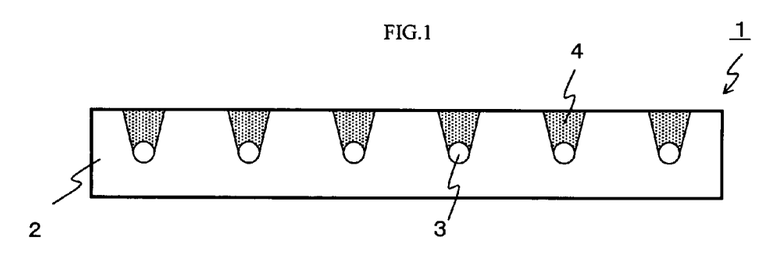
FIG. 1 is a typical example of a schematic cross sectional view of the heater plate of one embodiment of the invention.
Figure 2:
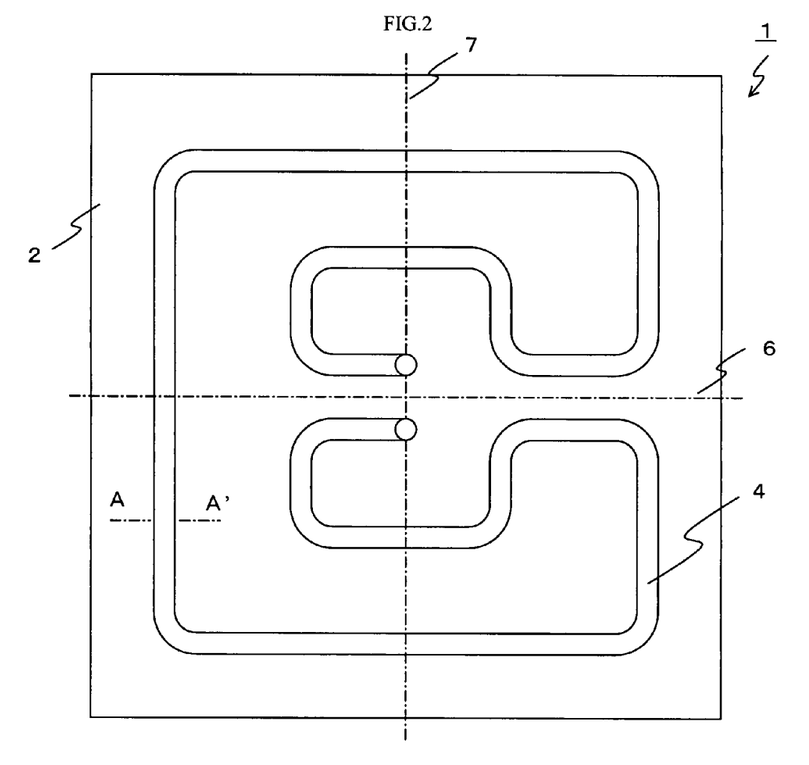
FIG. 2 is a schematic plan view of the heater plate of the invention.
Figure 3:
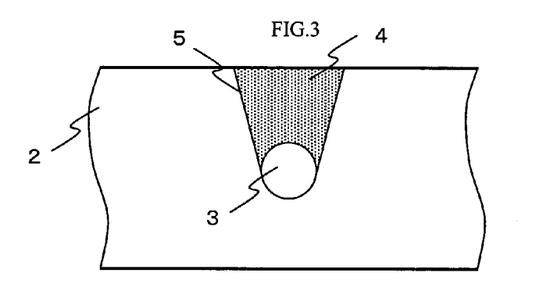
FIG. 3 is a schematic cross sectional view along A-A' in FIG. 2.

FIG. 1 is a typical example of a schematic cross sectional view of the heater plate of one embodiment of the invention. As shown in FIG. 1, the heater plate 1 has a construction in which the sheath heater 3 as the inner component is received in the base member 2 made of aluminum or aluminum alloy, and the joint member 4 made of aluminum or aluminum alloy is placed on the base member in such a manner that the sheath heater is hermetically sealed by the joint member and the base member. FIG. 2 is a schematic plan view of the heater plate 1, and FIG. 3 is a schematic cross sectional view along A-A' in FIG. 2. Groove portion 5 is formed in the base member 2 made of aluminum or aluminum alloy to receive the sheath heater 3 and the joint member 4 made of aluminum or aluminum alloy. As the base member made of aluminum or aluminum alloy, a thick member may be used, but practically, a plate member is preferable.

The sheath heater 3 is received in the groove portion 5, then the joint member made of aluminum or aluminum alloy is received thereon, and then the base member and the joint member are forge-pressed or metal bonded to be bonded, thereby hermetically sealing the sheath heater 3 between the joint member and the base member. The forge-pressing may include applying force while heating the base member and the joint member at an elevated temperature in order to perform a solid-state welding of the base member and the joint member at the tapered portions. The hermetic seal of sheath heater 3 between the joint member and the base member is provided by metallurgical continuity existing across a bond interface between the metal bonded base member and joint member.

Figure 4:
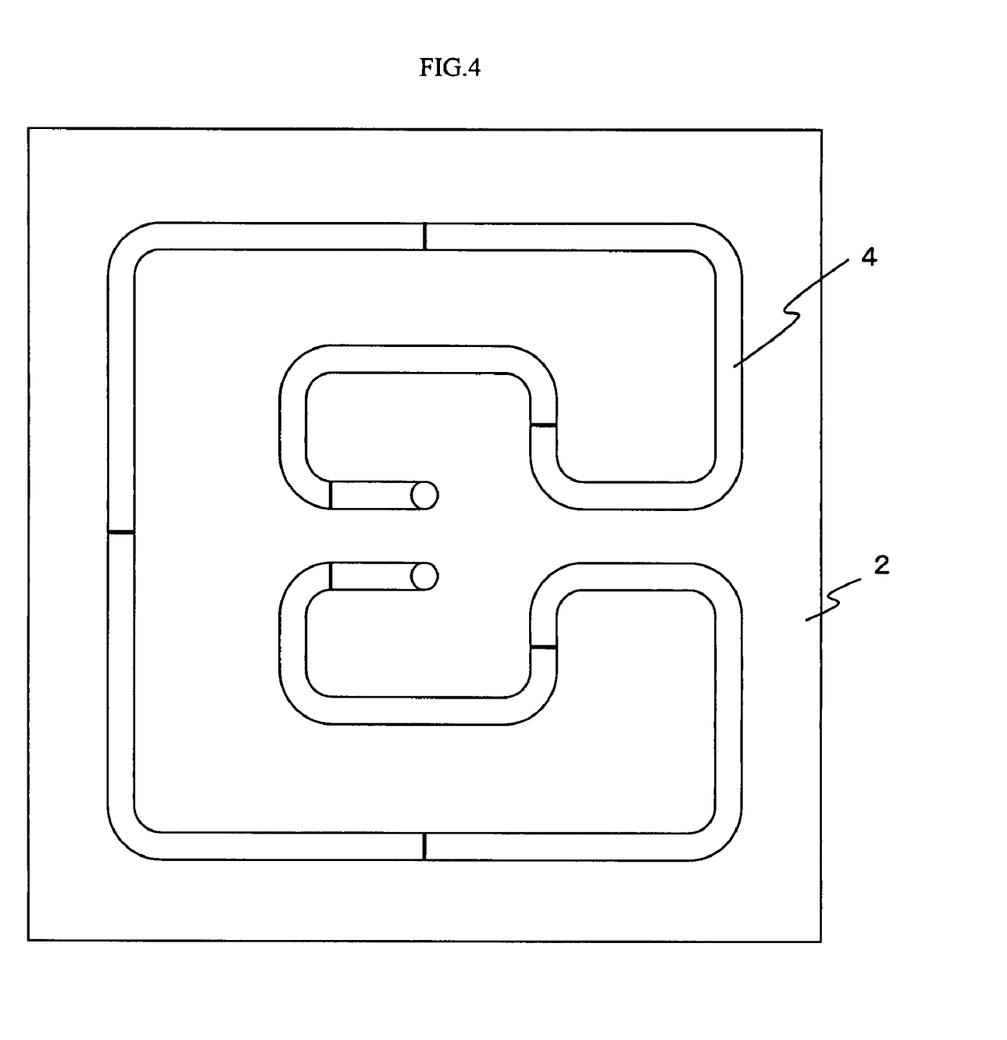
FIG. 4 is a schematic plan view of the heater plate of other embodiment of the invention.

FIG. 2 shows an example of the joint member comprising an integrated member. FIG. 4 shows an example of the joint member comprising a plurality of members divided along the surface of the base member 2. Similarly, the joint member comprising a plurality of members divided along the thickness direction may be used as shown in FIG. 7(b), 7(d). Accordingly, as shown in FIG. 4, and FIG. 7(b), 7(d), the divided joint members may be forge-pressed sequentially while the integrated joint member is forge-pressed at once.

Figure 5:
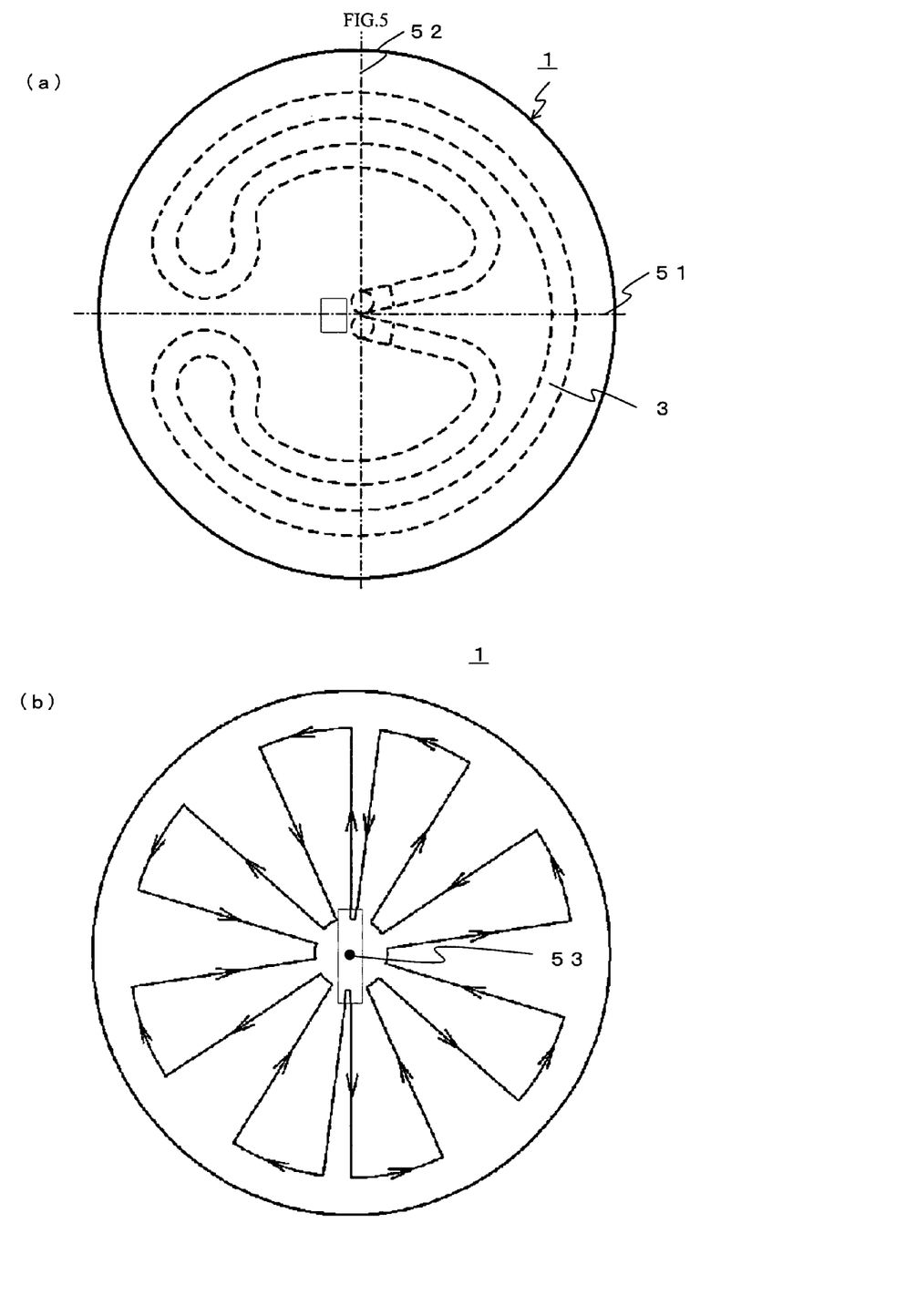
FIG. 5 is a schematic plan view of the circular heater plate.

A shape of the heater plate of the invention may be that as shown in FIG. 2, and in addition may be circular as shown in FIG. 5. It is preferable that the shape (i.e., layout) of the heater plate is symmetrical in relation to one of two orthogonal center lines in the cross section or point-symmetrical in relation to the center point in the cross section thereof. More specifically, the heater plate is symmetrical in relation to the center line 6 in FIG. 2, and the center line 51 in FIG. 5(*a*), whereas the heater plate is point-symmetrical in relation to the center point 53 in FIG. 5(*b*). The joint member made of aluminum or aluminum alloy of the invention comprises a substantially T-shaped or Y-shaped member in the cross section, and may have tapered portions, thus it is easy to align the joint member to the base member.

Although it is not shown, it is possible to place two heaters in parallel in the groove portion formed in the base member made of aluminum or aluminum alloy in the same manner as the layout described in FIG. 5(*a*) and 5(*b*). It is also possible to place two heaters in layers in the depth direction of the groove. Thus, a plurality of heaters can be received in at least one groove portions to prepare the heater plate. Furthermore, each heater may be placed in one groove portion respectively to prepare the heater plate. The groove portion to receive the sheath heater is designed in such manner that the heater plate may be uniformly heated to a prescribed temperature. It is possible to appropriately select the number of the groove and the heater.

Then, the joint member 4 made of aluminum or aluminum alloy is described in detail.

Figure 6:
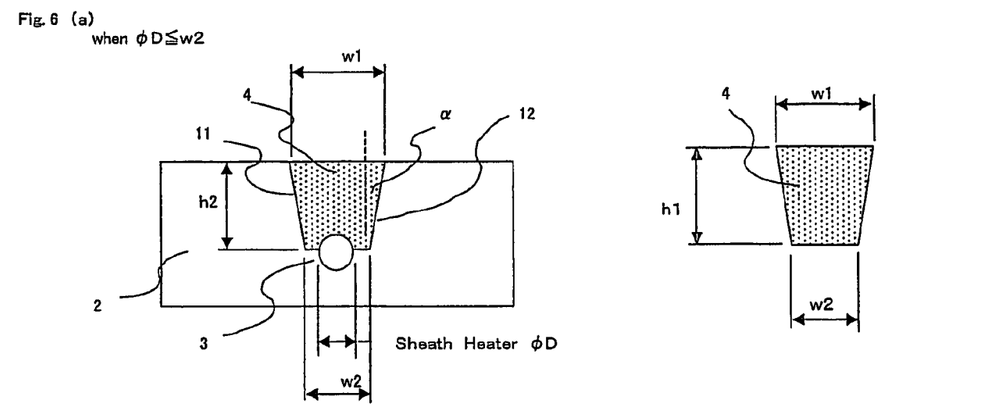
FIG. 6 is a schematic cross sectional view of the joint member made of aluminum or aluminum alloy.

FIG. 6 is an example of a schematic cross sectional view of the joint member 4 made of aluminum or aluminum alloy. As shown in FIG. 6, the joint member made of aluminum or aluminum alloy has corresponding tapered portions on at least a portion of two facing sides in the cross section in which the distance between two facing sides becomes narrow in a depth direction of the groove. As shown in FIG. 6(*a*), the facing two sides 11, 12 have the respective tapered portions having an angle α in relation to the vertical line. As shown in FIG. 6(*b*) and 6(*c*), the facing sides have respective two different portions. More specifically, the portions 13, 15 are parallel each other, and the portions 14, 16 have the respective tapered portions having an angle α in relation to the vertical line in FIG. 6(*b*). As shown in FIG. 6(*c*), the portions 17, 19 have the respective tapered portions having an angle α in relation to the vertical line, and the portions 18, 20 have the respective tapered portions having different angle β in relation to the vertical line. The width w2 of the face contacting with the sheath heater of the joint member 4 may be designed to be larger than the width of the sheath heater φD. Thus the joint member with the enlarged width makes the material of the member to flow in the outer peripheral sides of the heater so as to improve the close fitting between the sheath heater and the joint member. When the width of the joint member is enlarged, the groove in the base member is enlarged in correspondence with the enlarged amount of the width of the joint member. Also as shown in FIG. 6(*a*) and 6(*b*), the width w2 of the face contacting with the sheath heater of the joint member 4 is designed to be larger than the width of the sheath heater φD. The joint member with thus enlarged width makes the material of the member to flow in the outer peripheral sides of the heater so as to improve the close fitting between the sheath heater and the joint member, thus effective. Even in other cases not described above, when the width w2 of the face contacting with the sheath heater of the joint member 4 is designed to be larger than the width of the sheath heater φD, the material of the member effectively flows in the outer peripheral sides of the heater.

The tapered angle α and β in the tapered portion of the joint member is within a range of from over 0 to 45 degrees. The tapered angle within a range of from 1 to 30 degrees is particularly preferable. The reason for defining the angle within the above range is that when the tapered angle becomes large, the hydrostatic pressure stress on the tapered portion received from the groove wall portion in the base material reduces to lower the bondability, thus it may be difficult to obtain an excellent metal bonding, and in addition, the sizes of the joint member becomes unnecessarily large. Then, the joint member with the tapered portion is defined by the size W1 of the upper portion, the size W2 of the lower portion and the tapered angle, where the total height of the member is h1. The tapered portion is not limited to be a straight line, and a slow curved line may be used in the cross section. In the latter case, the tapered angle is not decided, however, a convenient line running the start point through the end point of the tapered portion may be applied to obtain the tapered angle. The tapered portion having a complex curved line in the cross section may be included within the scope of the invention.

The tapered portion in the joint member made of aluminum or aluminum alloy is designed to be as shown in FIG. 6 in the cross section so that the joint member 4 is surely inserted to the position where the sheath heater 3 is located, and forge-pressed to be metal bonded.

When the joint member made of aluminum or aluminum alloy has a tapered portion in cross section as shown in FIG. 6, the cross sectional area of the joint member 4 is larger than an effective cross sectional area obtained by subtracting the cross sectional area of the sheath heater 3 from the cross sectional area of the groove portion, in order for the joint member to be surely forge-pressed to the base member to be metal bonded. If the above condition is not satisfied, it is not possible to fully fill the joint member into the groove portion to be fully metal bonded. More specifically, there appears the gap between the sheath heater and the joint member so as to lower heat conductivity of the heater.

The relationship between the height h1 of the joint member and the lower width W3 or the lowest width W2 is preferably within a range of from 1 to 5 in FIG. 6, considering the relationship between the total thickness of the heater plate and the diameter of the heater, as well as the buckling resistance in case that the tapered angle is near 0 degree, although the above-mentioned relationship is not limited because the buckling resistance may be improved by adjusting the tapered angle. Furthermore, the above-mentioned relationship is preferably within a range of from 1 to 3, considering the resistance received from the tapered side when forge-pressing. Although it is possible to be bonded even with the relationship being 1, it is preferably at least 1, considering a thermal deformation and the strength of the bonded portion of the forge-pressed portion of the heater plate when used, thus the lower limit is defined as to be 1. For example, in case that the diameter of the sheath heater is 10 φ, the upper width W1, the lower width W2, and the height h are 15 mm, 10 mm, 30 mm respectively. Furthermore, since the joint member with the tapered portion described above is used, the joint member is fit in the groove portion in the base member with the guidance of the tapered portion, thus the close fitting of the joint member to the sheath heater is improved. In addition, the material of the joint member is filled in the groove portion formed in the base member 2, thus to be firmly metal bonded.

Then, the joint member made of aluminum or aluminum alloy having a T-shaped cross section or Y-shaped cross section is described.

Figure 7:
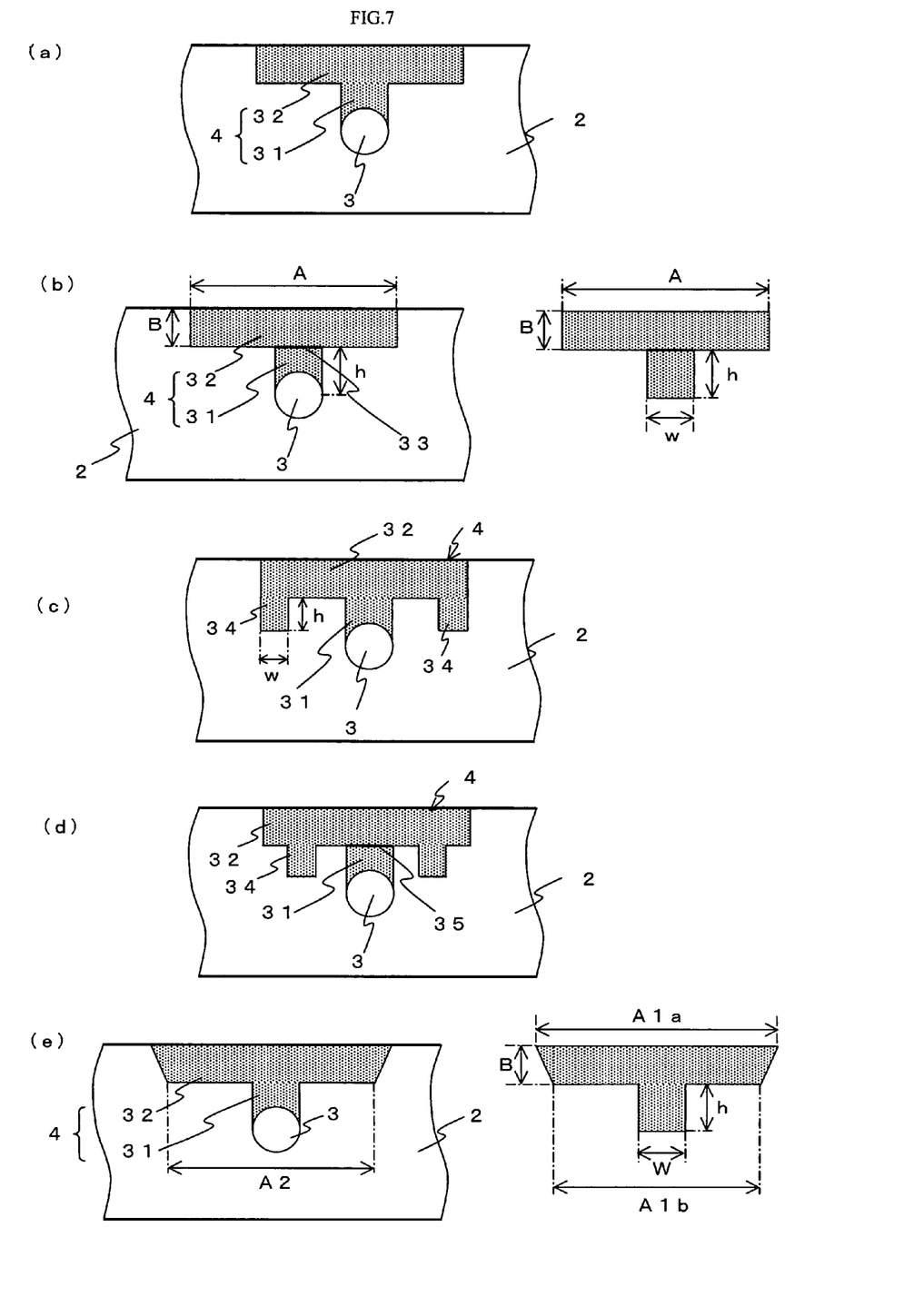
FIG. 7 shows examples of the joint member made of aluminum or aluminum alloy having T-shaped cross section.

FIG. 7 shows an example of the joint member made of aluminum or aluminum alloy having T-shaped cross section. As shown in FIG. 7(*a*), the T-shaped joint member 4 has a vertical bar portion 31 and a lateral bar portion 32 to be bonded with the base member 2 made of aluminum or aluminum alloy. More specifically, the vertical bar portion 31 of the T-shaped member to press the sheath heater 3, and additionally, the lateral bar portion 32 of the T-shaped member are bonded with the base member 2 made of aluminum or aluminum alloy. In this case, the corresponding concave portion for fitting to the T-shaped joint member 4 is provided in the base member 2.

As shown in FIG. 7(b), the T-shaped joint member comprises a vertical bar portion to press the heater and a lateral bar portion separated at the portion 33, to be bonded separately. In FIG. 7(b), the vertical bar portion as a whole is separated from the lateral bar portion, however, only a part of the vertical bar portion may be separately. Although it is possible to be bonded, when a ratio of the width to the length of the vertical bar portion 31 is up to 1, in either case of the vertical bar portion integrated or partly separated. The ratio of at least 1 is preferable, considering thermal deformation or the strength of the bonded portion of the forge-pressed portion of the heater plate when used. The ratio of up to 4 is preferable, considering the bucking strength of the protruding portion. The ratio within a range of from 1 to 3 is particularly preferable, considering the resistance received on the joint member from the side of the base member when forge-pressed. Accordingly, when the diameter of the sheath heater is 10 $\phi$, the width and the height of the vertical bar portion are 10 mm, 30 mm respectively, as shown in FIG. 7(b).

As shown in FIG. 7(c), the joint member 4 made of aluminum or aluminum alloy has the vertical bar portion 31, the lateral bar portion 32 and additional vertical bar portions 34, directly under which no sheath heater exists. In this case, convex portions and concave portions are provided at the corresponding positions in the base member to those of the joint member so as to be fit. In FIG. 7(c), although the portion 34 is extended downward to form the convex portion, it is possible that the portion 34 is recessed to form the concave portion, while the convex portion is formed in the corresponding position in the base member 2 to the convex portion. The volume of the additional vertical portion 34 formed as the convex portion is preferably larger than the concave portion formed in the base member to be fit thereto. The width of the concave portion is larger than the width of the convex portion. A ratio of the width to the length of the convex portion is preferably within a range of from 1 to 4, more preferably from 1 to 3, as same as shown in FIG. 7(b). Thus formed protruding (convex) portions makes the bonding more firm of the joint member with the base member both made of aluminum or aluminum alloy.

As shown in FIG. 7(d), the joint member comprises T-shaped member having the vertical bar portion 31, the lateral bar portion and additional vertical bar portion, as same as shown in FIG. 7(c), however, the vertical bar portion 31 to press the sheath heater is separated from the remaining portion, thus bonding separately. In this case, not a whole vertical bar portion but a part of the vertical bar portion may be separated from the remaining portion of the joint member. Although the location of the vertical bar portion is different from that in FIG. 7(c), the location of the vertical bar portion 34 may be appropriately adjusted, if necessary.

As shown in FIG. 7(e), the width A1 of the lateral bar portion in the joint member made of aluminum or aluminum alloy is larger than the width A2 of the corresponding groove portion formed in the base member to be fit. In addition, the lateral bar portion may has tapered portions on the end portion thereof as defined in that the width A1a of the upper surface is larger than the width A1b of the lower surface, thus the width of the lateral bar portion is preferably larger than the width of the groove portion in the base member.

A ratio of the width A to the height B in the lateral bar portion of T-shaped member is not specifically limited, however, if the width is unnecessarily large, the material is to be wasted. At the most, it is sufficient that the width of the lateral bar portion is 5 to 6 times of the width of the receiving portion for the heater. The height (thickness) may be designed to obtain sufficient strength to fix the joint member, i.e., within a range of from 5 mm to 20 mm. When the diameter of the sheath heater is 10 $\phi$, the width A of the lateral bar portion is within a range of from 30 to 60 mm, preferably 50 to 60 mm, the height B being within a range of from 5 to 20 mm.

Figure 8:
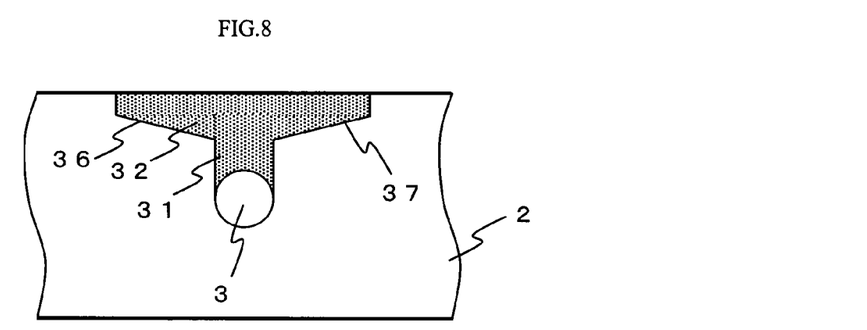
FIG. 8 shows an example of the joint member made of aluminum or aluminum alloy having a Y-shaped cross section.

FIG. 8 shows an example of the joint member made of aluminum or aluminum alloy having a Y-shaped cross section. The Y-shaped member as shown in FIG. 8 has a lateral bar portion each lower side 36, 37 of which extends downward to the center thereof, whereas the lateral bar portion 32 of the T-shaped member has a rectangle cross section as shown in FIG. 7. The cross sectional area of the lateral bar portion in the T-shaped or Y-shaped member is larger than the cross sectional area of the corresponding lateral portion of the groove, and the cross sectional area of the vertical bar portion in the T-shaped member or Y-shaped member is larger than the cross sectional area of the corresponding vertical portion of the groove excluding the cross sectional heater portion, in case that the lateral bar portion and the vertical bar portion are considered to be independent each other. In order to sufficiently joint the T-shaped or Y-shaped joint member to the base member, each of the lateral bar portion and the vertical bar portion has to be sufficiently metal-bonded with the base member.

The cross sectional area of the joint member is preferably larger than an effective cross sectional area obtained by subtracting the cross sectional area of the sheath heater from the cross sectional area of the groove portion formed in the base member, when the cross sectional area of the joint member of the invention has a substantially T-shaped or Y-shaped cross sectional area.

The width of the joint member is preferably designed to be narrower at least a part than the width of the groove portion of the base member so that there is a gap in at least a portion between a side face of the joint member and the groove portion of the base member, when the joint member is fitted into the groove portion of the base member. It is possible to insert the joint member 4 deeper into the bottom of the groove portion, thus the joint member and the sheath heater is closely fitted.

Furthermore, in case that the cross section of the joint member of the invention is substantially T-shape or Y-shape, the ratio of the height to the width of the vertical bar portion 31, 34 is preferably within a range of from 1 to 4. In addition, the width of the groove portion in the base member is larger than the width of the vertical bar portion in the joint member. It is necessary that the cross sectional area of the vertical bar portion is larger than the cross sectional area obtained by substituting the cross sectional area of the sheath heater from the cross sectional area of the groove portion receiving the vertical bar portion in the base member. Due to the above configuration, the joint member is forge-pressed within a space formed by the groove portion in the base member so as to realize the metal bonding of the vertical bar portion of the joint member with the groove portion contacting with the vertical bar portion of the base member.

Figure 9:
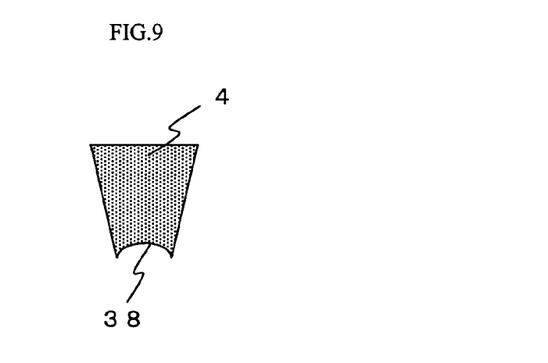
FIG. 9 is a schematic cross sectional view of the joint member made of aluminum or aluminum alloy in which a surface to directly contact with the sheath heater has the same curvature as that of the sheath heater in the same direction.

The face of the joint member 4 made of aluminum or aluminum alloy to directly contact with the sheath heater 3 preferably has a flat surface parallel to the plate surface of the base member 2 made of aluminum or aluminum alloy or curved surface having the same curvature in the direction as the outer surface of the sheath heater. FIG. 9 is an example of the schematic cross sectional view of the joint member made of aluminum or aluminum alloy in which a surface to directly contact with the sheath heater has the same curvature in direction as that of the sheath heater. Due to the above configuration of the face 38 directly contacting with the sheath heater, the base member 2 and the joint member 4 are bonded without vacant space to the sheath portion of the sheath heater 3, thus the higher hermetical sealing and excellent heat transfer property are obtained. In addition, since the quality of the sheath portion is improved to protect the insulating material within the sheath portion, a high electric insulation can be maintained.

Any one of alloy consisting of JIS1050, 1100, 3003, 3004, 5005, 5052, 6063, 6061, 7003, and 7N01 may be used for the base member 2 and the joint member 4 made of aluminum or aluminum alloy of the heater plate of the invention.

As other embodiment of the heater plate of the invention, the sheath heater may comprises a pipe configuration having a circular cross section or substantially rectangle (including square) with corner portions to be curved at a prescribed curvature, or a braided pipe configuration formed by braiding narrow bars.

Then, a method for manufacturing the heater plate is described.

In the heater plate 1 of the present invention, the groove portion is formed in the base member 2 made of aluminum or aluminum alloy in which the sheath heater 3 as an inner component and the joint member 4 made of aluminum or aluminum alloy are inserted. After the sheath heater 3 is received in the groove portion 5, the joint member to fill the space in the groove portion is inserted thereon. Then, the joint member and the base member made of aluminum or aluminum alloy are metal-bonded by forge-pressing to manufacture the heater plate. The base member made of aluminum or aluminum alloy may be aluminum alloy plate.

In the method for manufacturing the heater plate, it is preferable to clean the surface of the members as a step of the pre-treatment. In case of aluminum or aluminum alloy for example, it is preferable to clean the surfaces of the members by appropriately combining the steps of (1) removing oil from the surface by nitric acid, (2) water washing, (3) caustic treatment (etching by alkali solution), (4) water washing, (5) cleansing by nitric acid, (6) water washing, (7) hot-water washing and the like. This is because the bondability is improved by cleaning the surfaces of the members before forge-pressing.

Furthermore, as a finishing process after forge-pressing the base member 2 and the joint member 4 made of aluminum or aluminum alloy, cutting, grinding, alumite treatment and shot blasting are preferable. Due to the cutting after forge-pressing, the deformation can be removed of the heater plate near the pressed portion on the pressing face which is caused by the joint member excessively pressed in the groove portion over the effective volume in the base member by the treatment followed such as grinding or the like.

The base member 2 and the joint member 4 are forge-pressed to be metal-bonded at the temperature within a range of from 250 to 500 degree centigrade, preferably from 300 to 450 degree centigrade, more preferably from 350 to 420 degree centigrade. It is the merit that the forge-pressing is carried out for a very short time comparing to the welding, particularly when the joint member is an integrated member.

After forge-pressing, the heater plate is naturally cooled to a room temperature. Then, although the stress is built in the heater plate due to the contraction difference between the base member made of aluminum or aluminum alloy and the sheath heater made of stainless steel, the heater plate is not deformed since the proof strength of the base member at room temperature is large. In addition, the sheath heater is not deformed or damaged, since the strength of the sheath heater made of stainless steel is high. More specifically, the heater plate is formed by forge-pressing at the temperature around 400 degree centigrade, and when used, the heater plate is heated to the temperature around 400 degree centigrade (i.e., the temperature range for usage is around 400 degree centigrade). This means that the heater plate returns to the situation in which the forge-pressing is just finished. The stress built between the members made of aluminum and the sheath heater made of stainless steel therefore becomes very small, thus there is no fear that the heater plate is deformed or the sheath heater is deformed or damaged.

In the method for manufacturing the heater plate of the invention, as aluminum or aluminum alloy used for the base member and the joint member, any one of JIS1050, 1100, 3003, 3004, 5005, 5052, 6063, 6061, 7003, and 7N01 may be selected. Although the material and process of aluminum or aluminum alloy base member 2 are not specifically limited, it is preferable to use the rolled plate or forged product which has few inner defect, considering a leak resistance thereof. As the aluminum material, JIS1050 having at least 99.5% purity is most preferable, in view of the corrosion resistance to the cleansing gas. Although the alloy having higher strength than 1100, 6061 or the like comes to be used, considering the prevention of the creep deformation according to the large sizing of the heater plate, the aluminum or aluminum alloy listed above may be used too. In addition, Al—Mg alloy such as 5005, 5052 or the like which contains low magnesium satisfies press bonding property, therefore the alloy can be used in a specific composition range to secure the effective metal bonding.

When the base member 2 and the joint member 4 made of aluminum or aluminum alloy are the same material, both materials are press bonded by the deformation due to forge pressing, thus physically the metal bonding is easily produced. Even when the base member 2 and the joint member 4 made of aluminum or aluminum alloy are different materials, both materials are press bonded by the deformation due to forge pressing, thus physically metal bonded. For example, different materials of aluminum material of JIS1000 series and aluminum material of JIS3000 series are physically metal-bonded.

When the joint member 4 made of aluminum or aluminum alloy to fill the groove portion 5 are divided into a plurality of members along the surface of the base member 2 made of aluminum or aluminum alloy, as shown in FIG. 3, it is possible to forge-press either all the members at once, or one member at a time in a prescribed order. When divided members are forge-pressed one member at a time, the portion to be forge-pressed at one time becomes small so that a small pressing machinery is applicable. Furthermore, when the member is divided into a plurality of members along the width direction of the base member, as shown in FIG. 7(b), (d), the divided members are forge-pressed one at a time, or the divided members may be combined and forge-pressed at once.

In this case, in each of plurality of joint member made of aluminum or aluminum alloy, the upper surface of the member is longer than the lower surface of the member, and end surfaces of the joint member have respective tapered portions, in addition, the upper surface of the joint member is longer than the length of the groove portion for embedding the heater in the base member, thereby the plurality of joint members apply pressure each other to cause plastic-deform and metal-bonded by forge pressing, thus boundaries of the plurality of joint members can be fully metal-bonded by forge pressing. The bonding between the joint member and the base member is carried out preferably only by the forge-pressing so that the manufacturing steps are simplified. However, each end portion of the plurality of joint members is bonded by electronic beam welding or soldering, and thus bonded plurality of joint members which length is shorter than that of the groove portion in the base member can also be applied.

In the method for manufacturing the heater plate of the invention, the joint member 4 made of aluminum or aluminum alloy has tapered portions having an angle within a range of from over 0 to 45 degrees in the cross section, and the tapered portions are inserted into the groove portion 5 formed in the base member 2 made of aluminum or aluminum alloy to be metal-bonded by forge-pressing.

In other method for manufacturing the heater plate 1 of the invention, the joint member made of aluminum or aluminum alloy has the cross section of substantially T-shape or Y-shape, while the base member made of aluminum or aluminum alloy has convex portion or concave portion at the location corresponding to the substantially T-shaped or Y-shaped member for fitting. The substantially T-shaped or Y-shaped joint member 4 is fitted to the corresponding convex portion or concave portion in the base member 2, and forge-pressed to be metal-bonded. The convex portion or concave portion may be provided on a portion excluding the vertical bar portion to press the sheath heater 3 in the joint member 4 made of aluminum or aluminum alloy.

In a method for manufacturing the heater plate 1 of the invention, it is preferable that a face of the joint member to contact with the sheath heater is configured to be a parallel face to a face of the base member or a curved face having a same curvature in the same direction as an outer periphery of the sheath heater.

In a method for manufacturing the heater plate 1 of the invention, a real cross sectional area of the joint member is preferably larger than an effective cross sectional area obtained by subtracting a cross sectional area of the sheath heater from a cross sectional area of the groove portion in the base member, thereby the close adhesion between the base member 2 and the sheath heater 3 is more improved by the forge pressing. There is preferably a gap in at least a portion between the side face of the joint member and the side face of the groove portion of the base member, when the joint member 4 is fitted to the base member, thereby the joint member is surely inserted to the sheath heater by forge pressing to more improve the close adhesion between the base member 2 and the sheath heater 3.

According to the method for manufacturing the heater plate of the invention described above, the close adhesion between the base member 2 and the sheath heater 3 is more improved to result in remarkable improvement in the heat transfer property from the sheath heater 3 to the base member made of aluminum or aluminum alloy, thus the lifetime of the sheath heater is lengthened. In addition, in the method for manufacturing the heater plate 1 of the invention, since the forge pressing is implemented at the temperature of around 400 degree centigrade which is the temperature the heater plate is used, the stress built between the aluminum material and the stainless steel sheath material is very small, thus the heater plate can be used for a long period of time without producing distortion in the heater plate.

In the present invention, two aluminum or aluminum alloy plates are not metal-bonded by forge pressing, but only the portion in which the sheath heater is embedded is forge-pressed to be metal-bonded, thereby preventing the deformation by the thermal stress of the heater plate. Therefore, even if the heater plate becomes large, only the vicinity of the sheath heater is forge-pressed, thus the power of the forge pressing machinery can be reduced comparing to the conventional bonding by pressing entire of the plates. The area in the material to be pressed by pressing machinery may be smaller, thus it is possible to avoid the large sizing of the pressing machinery, and furthermore, to save the working troubles comparing to forge pressing the entire plates.

According to the invention, the joint member 4 has tapered portions, or there provided a gap in at least a portion in the side face of the groove portion of the base member, when the joint member 4 is fitted to the base member, thereby it becomes possible that the joint member 4 is surely inserted to reach the sheath heater by forge pressing.

According to the invention, the sheath heater and the joint member made of aluminum or aluminum alloy are received in the groove portion formed in the base member made of aluminum or aluminum alloy, and the joint member and the base member are forge-pressed to be metal-bonded, thus high hermetical sealing can be maintained between the base member and the sheath heater, resulting in obtaining more higher heat transfer property.

According to the invention, since the metal bonding by forge pressing of the joint member and the base member is carried out at the temperature of around the heating region in which the heater plate is used, the stress due to linear expansion difference between the base member made of aluminum or aluminum alloy and the sheath material of the inner heater can be reduced, thus preventing deformation or damage of the sheath heater, deformation of the heater plate or the like. At the same time, the close adhesion and heat transfer property between the joint member and the base are improved.

The technique of the invention is applied to aluminum or aluminum alloy material, however this is not limited to the aluminum or aluminum alloy material. As far as the metal joint member and the metal base member can be metal-bonded by forge pressing, and excellent heat transfer property can be obtained, any metal material can be used. As the metal material, the material having a large linear expansion coefficient is more preferable, considering the lifetime of the heater.

Copper or copper alloy can be listed as the material which can be forge pressed to be metal bonded, has excellent heat transfer property, and has a large linear expansion coefficient. The same heater plate as described above can be obtained by using copper or copper alloy material. It is preferable that the forge pressing to be metal-bonded is carried out at the temperature within a range of from 700 to 900 degree centigrade, when the heater plate is manufactured by using copper or copper alloy material.

Accordingly, the heater plate of the invention is manufactured by the following steps, i.e., the sheath heater is received in the groove portion formed in the metal or metal alloy base member, the same metal or metal alloy joint member is fitted to the groove portion, and the joint member and the base member are metal-bonded by forge-pressing. As the metal material, those metal as having a low forge-pressing temperature and light weight are preferable, considering the heat transfer property, linear expansion coefficient, in addition, workability and easy handling. For this purpose, aluminum or aluminum alloy is excellent, thus in the invention, aluminum or aluminum alloy is used for both of the joint member and the base member.

What is claimed is:

1. A heater plate manufactured by receiving a sheath heater within a groove portion formed in a base member made of aluminum or aluminum alloy, placing at least one joint member made of aluminum or aluminum alloy into said groove portion so as to fix said sheath heater in the groove portion, wherein said joint member has two correspondingly tapered portions facing each other which extend toward a lower end in a direction of gravity thereof in a manner that a distance between said two tapered portions becomes narrower, and a width of a surface portion contacting with said sheath heater in said joint member is larger than a width of said sheath heater and metal bonding said base member to said joint member by forge-pressing, in a manner that a force is added from an upper surface of said base member toward said sheath heater direction, with said sheath heater fixed in place therebetween and hermetically sealed thereby;
   wherein said forge-pressing comprises applying said force while heating said joint base member and said joint member at an elevated temperature in order to perform a solid-state welding of said base member and said joint member at said tapered portions;
   wherein metallurgical continuity exists across a bond interface between said metal bonded base member and said metal bonded joint member, thus providing a hermetical seal of said sheath heater.

2. The heater plate as claimed in claim 1, wherein said joint member comprises a single member.

3. The heater plate as claimed in claim 1, wherein said joint member comprises a plurality of members arranged along a surface direction of said base member.

4. The heater plate as claimed in claim 1, wherein said joint member comprises a plurality of members arranged along a thickness direction of said base member.

5. The heater plate as claimed in claim 1, wherein a layout of said sheath heater is point-symmetrical in relation to a center point in a cross section or symmetrical in relation to one of two orthogonal center lines in a cross section of said base member.

6. The heater plate as claimed in claim 1, wherein said base material comprises a plate member.

7. The heater plate as claimed in claim 1, wherein a cross sectional area of said joint member is larger than an effective cross sectional area obtained by subtracting a cross sectional area of said sheath heater from a cross sectional area of said groove portion.

8. The heater plate as claimed in claim 1, wherein a ratio of a height of said joint member to a width of a lower end of said tapered portions or a width of a lower end of said joint member is within a range from 1 to 5.

9. The heater plate as claimed in claim 1, wherein an angle of the respective tapered portions of said joint member is within a range from over 0 to 45 degrees in relation to a vertical axis thereof.

10. The heater plate as claimed in claim 1, wherein a face of the joint member to contact with the sheath heater is configured to be a parallel face to a face of the base member or a curved face having a same curvature as an outer periphery of said sheath heater.

11. The heater plate as claimed in claim 1, wherein a cross sectional area of the joint member before forge-pressing is larger than an effective cross sectional area obtained by subtracting a cross sectional area of said sheath heater from a cross sectional area of said groove portion in the base member, and there is a gap in at least a portion between a side face of the joint member and the groove portion of the base member, when the joint member is fitted into the groove portion of the base member.

12. The heater plate as claimed in claim 1, wherein said sheath heater is arranged in each of a plurality of groove portions or a plurality of the sheath heaters are arranged in each of at least one groove portions formed in the base member.

13. The heater plate as claimed in claim 12, wherein said plurality of the sheath heaters are arranged in parallel in each of at least one groove portions formed in the base member.

14. The heater plate as claimed in claim 12, wherein said plurality of the sheath heaters are layered in a height direction in each of at least one groove portions formed in the base member.

15. The heater plate as claimed in claim 1, wherein said sheath heater comprises a pipe configuration having a circular cross section or substantially rectangle (including square) with corner portions to be curved at a prescribed curvature, or a braided pipe configuration formed by braiding narrow bars.

16. The heater plate as claimed in claim 1, wherein a sheath portion of the sheath heater has an excellent heat conduction to said joint member and said base member which receive the sheath heater.

17. The heater plate as claimed in claim 1, wherein said joint member and said base member in which the sheath heater is received are hermetically sealed.

18. The heater plate as claimed in claim 1, wherein the sheath heater has an excellent electrical insulation to said joint member and said base member which receive the sheath heater.

19. The heater plate as claimed in claim 1, wherein said joint member and said base member comprises any one of alloy consisting of JIS1050, 1100, 3003, 3004, 5005, 5052, 6063, 6061, 7003, and 7N01.

20. A method for manufacturing a heat plate comprising the steps of:
   receiving a sheath heater within a groove portion formed in a base member made of aluminum or aluminum alloy;
   placing at least one joint member made of aluminum or aluminum alloy into said groove portion so as to fix said sheath heater in the groove portion wherein said joint member has two correspondingly tapered portions facing each other which extend toward a lower end in a direction of gravity thereof in a manner that a distance between said two tapered portions becomes narrower, and a width of a surface portion contacting with said sheath heater in said joint member is larger than a width of said sheath heater; and
   metal bonding said base member to said joint member by forge-pressing, in a manner that a force is added from an upper surface of said base member toward said sheath heater direction, with said sheath heater fixed in place therebetween and hermetically sealed thereby;
   wherein said-forge-pressing comprises applying said force while heating said joint base member and said joint member at an elevated temperature in order to perform a solid-state welding of said base member and said joint member at said tapered portions;
   wherein metallurgical continuity exists across a bond interface between said metal bonded base member and said metal bonded joint member, thus providing a hermetical seal of said sheath heater.

21. The method as claimed in claim 20, wherein said joint member comprises a single member or divided plurality of members.

22. The method as claimed in claim 20, wherein said joint member comprises a plurality of members divided in a surface direction or a width direction of said base member.

23. The method as claimed in claim 20, wherein a cross sectional area of said joint member is larger than an effective cross sectional area obtained by subtracting a cross sectional area of said sheath heater from a cross sectional area of said groove portion.

24. The method as claimed in claim 20, wherein in case that said joint member are divided into a plurality of member, said plurality of members are forge-pressed in a prescribed order.

25. The method as claimed in claim 20, wherein said base member comprises a plate member.

26. The method as claimed in claim 20, wherein an angle of said tapered portions of said joint member is within a range from over 0 to 45 degrees in relation to a vertical axis thereof.

27. The method as claimed in claim 20, wherein a face of the joint member to contact with the sheath heater is configured to be a flat face parallel to a plate face of the base member or a curved face having a same curvature as an outer periphery of said sheath heater.

28. The method as claimed in claim 20, wherein a cross sectional area of the joint member before forge-pressing is larger than an effective cross sectional area obtained by subtracting a cross sectional area of said sheath heater from a cross sectional area of said groove portion in the base member, and there is a gap in at least a portion between a side face of the joint member and the groove portion of the base member, when the joint member is fitted into the groove portion of the base member.

29. The method as claimed in claim 20, wherein said joint member and said base member comprises any one of alloy consisting of JIS1050, 1100, 3003, 3004, 5005, 5052, 6063, 6061, 7003, and 7N01.

30. The method as claimed in claim 20, wherein said forge-pressing is carried out at a temperature within a range of from 250 to 500 degree centigrade.

31. A heater plate manufactured by receiving a sheath heater within a groove portion formed in a base member made of metal or metal alloy, placing joint member made of same kind of metal or metal alloy into said groove portion and fixing, wherein said joint member has two correspondingly tapered portions facing each other which extend toward a lower end in a direction of gravity thereof in a manner that a distance between said two tapered portions becomes narrower, and a width of a surface portion contacting with said sheath heater in said joint member is larger than a width of said sheath heater, and metal bonding said base member to said joint member by forge-pressing for hermetic seal of said sheath heater in a manner that a force is added from an upper surface of said base member toward said sheath heater direction, wherein said forge-pressing comprises applying said force while heating said joint base member and said joint member at an elevated temperature in order to perform a solid-state welding of said base member and said joint member at said tapered portions;

wherein metallurgical continuity exists across a bond interface between said metal bonded base member and said metal bonded joint member, thus providing a hermetical seal of said sheath heater.

32. The heater plate as claimed in claim 31, wherein both of said base member and said joint member are copper or copper alloy.

33. A heater plate comprising:

a base member made of aluminum or aluminum alloy and having a groove portion formed therein;

a sheath heater received in said groove portion;

a joint member made of aluminum or aluminum alloy and having two tapered portions facing each other and narrowing towards a lower end in a direction of gravity, wherein at said lower end, said tapered portions have a width of a surface contacting with said sheath heater, said width being larger than a width of said sheath heater;

said base member being metal bonded to said joint member at said tapered portions so that metallurgical continuity exists across a bond interface between said metal bonded base member and said metal bonded joint member; and said sheath heater being hermetically sealed by said joint member and said base member metal bonded thereto by means of said metallurgical continuity.

* * * * *